United States Patent [19]
Taylor et al.

[11] Patent Number: 5,741,445
[45] Date of Patent: Apr. 21, 1998

[54] METHOD OF MAKING LIGHTWEIGHT CLOSED-BACK MIRROR

[75] Inventors: Raymond L. Taylor, Swampscott; Michael A. Pickering, Dracut; Lee E. Burns, Reading, all of Mass.

[73] Assignee: CVD, Incorporated, Woburn, Mass.

[21] Appl. No.: 596,021

[22] Filed: Feb. 6, 1996

[51] Int. Cl.$^6$ .................................................. B29D 11/00
[52] U.S. Cl. .................... 264/1.21; 264/1.9; 264/2.6; 264/81; 264/82
[58] Field of Search ............................ 264/1.21, 1.9, 264/2.5, 2.6, 81, 82

[56] References Cited

U.S. PATENT DOCUMENTS

| | | | |
|---|---|---|---|
| 3,484,327 | 12/1969 | Denman. | |
| 3,496,052 | 2/1970 | Odenthal. | |
| 3,502,455 | 3/1970 | Gardner | 65/31 |
| 3,507,737 | 4/1970 | Busdiecker et al.. | |
| 4,142,006 | 2/1979 | Choyke et al. | 427/162 |
| 4,292,375 | 9/1981 | Ko | 428/593 |
| 4,378,626 | 4/1983 | Eitel | 29/527.2 |
| 4,444,467 | 4/1984 | Shuskus et al. | 350/310 |
| 4,447,130 | 5/1984 | Christiansen et al. | 350/310 |
| 4,466,700 | 8/1984 | Christiansen et al. | 350/310 |
| 4,488,920 | 12/1984 | Danis | 156/155 |
| 4,492,669 | 1/1985 | Gould | 419/5 |
| 4,578,303 | 3/1986 | Kundinger et al. | 428/116 |
| 4,617,232 | 10/1986 | Chandler et al. | 428/328 |
| 4,678,292 | 7/1987 | Miyatani et al. | 350/609 |
| 4,716,064 | 12/1987 | Holzl et al. | 428/73 |
| 4,824,711 | 4/1989 | Cagliostro et al. | 428/116 |
| 4,856,887 | 8/1989 | Wakugawa et al. | 350/641 |
| 4,917,934 | 4/1990 | Sempolinski | 428/116 |
| 4,956,217 | 9/1990 | Heitkamp | 428/116 |
| 4,963,393 | 10/1990 | Goela et al. | 427/248.1 |
| 4,990,374 | 2/1991 | Keeley et al. | 427/255.1 |
| 5,071,596 | 12/1991 | Goela et al. | 264/1.2 |

FOREIGN PATENT DOCUMENTS

| | | |
|---|---|---|
| 224252 | 5/1958 | Australia. |
| 411910 | 2/1991 | European Pat. Off.. |
| 2545037 | 11/1984 | France. |
| 4326762 | 2/1995 | Germany. |
| 409323 | 5/1934 | United Kingdom. |

OTHER PUBLICATIONS

*Making Lightweight Structures by Vapor Deposition*, NASA TechBriefs, vol. 14, No. 11, pp. 81–82, Nov. 1990.

Goela et al., *Rapid Fabrication of Lightweight Ceramic Mirrors via Chemical Vapor Deposition*, Applied Physics Letters, vol. 54, No. 25, p. 2512–2514, Jun. 1989, American Institute of Physics, New York, New York.

*Primary Examiner*—Christopher A. Fiorilla
*Attorney, Agent, or Firm*—Taylor J. Ross; Gerald K. White

[57] ABSTRACT

A method of forming a light weight, closed-back mirror. The mirror is formed as a monolithic construction by the use of chemical vapor deposition techniques. A first deposition forms sheets of the material, which are machined to the proper size to form reinforcing ribs. A sacrificial mandrel is formed with grooves to receive the ribs in their assembled positions. The upper surface of the mandrel is in proximity to the rear edges of the ribs to form a substantially continuous surface. The mandrel and ribs are then subjected to a chemical vapor deposition process which forms a first coating upon the outer face of the mandrel, forming a back plate and side wall. The mandrel is then turned over, and the base is removed by machining to expose the front edges of the ribs. This process leaves islands of mandrel material between the ribs to form a substantially continuous surface. The mandrel and ribs are then subjected to a chemical vapor deposition process. This forms a second coating upon the lower surface of the mandrel, used as the mirror face. To reduce weight, holes are drilled through the back plate, and the remaining, encapsulated, mandrel material is removed by oxidation.

30 Claims, 2 Drawing Sheets

METHOD OF MAKING LIGHTWEIGHT CLOSED-BACK MIRROR

BACKGROUND OF THE INVENTION

1. Field of the Invention

The present invention relates in general to light weight, high quality ceramic mirrors, and methods of making same. In particular, the present invention relates to an improved light weight, closed-back mirror formed by chemical vapor deposition techniques, and methods of making same.

2. Description of the Related Art

In the field of optics, light detection and ranging (LIDAR) has come to be recognized as an important diagnostic tool for remote measurement of a diversity of atmospheric parameters such as minor species concentrations, pressure, temperature, and water vapor profiles, aerosol cloud distributions, and wind fields. LIDAR techniques such as measurement of back scattered signals, differential absorption, and Doppler shifts have been used to obtain information about the earth's atmosphere.

The performance of a LIDAR system depends upon the optical configuration of its receiving telescope. Often, due to space limitations such as in a shuttle-borne LIDAR system, the length of the telescope is fixed. Therefore, the optical designer must select a particular shape and optic speed of the mirrors to maximize the throughput of the telescope. The most critical element of the receiving telescope is the primary mirror because of its size, weight, fabrication cost, and thermal exposure to the outside world. Since the received signal is directly proportional to the area of the primary mirror, it is important to use as large a primary mirror as feasible to obtain reasonable signal levels for accurate measurement. This is particularly true when a space-borne LIDAR system is used to measure wind profiles in the troposphere on a global basis.

The conventional techniques employed in the prior art for fabricating large (>1.0 m diameter) mirrors are quite slow and time consuming. These processes can take several months to years to form a large mirror from silica glass or Zerodur. A spin casting technique has been proposed to fabricate large mirrors, but the weight of the resulting mirrors is an order of magnitude greater than is permissible for many space-based applications.

To overcome these problems, the present assignee has proposed a process of forming large, light weight mirrors using chemical vapor deposition (CVD), as detailed in U.S. Pat. No. 5,071,596 to Goela et al. issued Dec. 10, 1991. In this process, a mandrel is formed with a negative image of the mirror face. A layer of silicon carbide is then deposited on the mandrel, with this layer to form the mirror face. To provide strength and rigidity, a graphite honeycomb structure is placed on the rear face of the silicon carbide layer. A second CVD process is performed to coat the honeycomb, giving it greater strength and bonding it to the mirror. The mirror and honeycomb combination is then removed from the mandrel. A third and final CVD coating may be applied to the mirror face (opposite the honeycomb).

While this process provides a mirror which is light weight and has very good strength, thermal conductivity and optical properties, it is expensive. This is due primarily to the cost of performing the multiple CVD processes. Additionally, while good matches can be made between the thermal conductivity of the graphite and the SiC coating, some differences are present, and cause stresses. Finally, the mirror formed by this method has an open back, reducing its rigidity.

SUMMARY OF THE INVENTION

An object of the present invention is to provide a method of making a mirror which permits extremely precise optical characteristics.

Another object of the present invention is to provide such a method which results in a mirror which is light weight, and most preferably within the parameters acceptable for orbital payloads.

Yet another object of the present invention is to provide such a method which produces a rigid mirror, of the type having a face plate, a back plate spaced from the face plate and a plurality of supporting ribs secured between the face and back plates.

Yet another object of the present invention is to provide such a method which results in such a mirror being formed from a monolithic, inert material having excellent strength and low thermal expansion.

A further object of the present invention is to provide mirrors formed by such methods.

These and other objects are achieved by a method of forming a light weight, closed-back mirror, such as the type suitable for satellite use. The mirror is formed as a monolithic construction by the use of chemical vapor deposition techniques. The preferred material formed by this deposition is high purity β-phase silicon carbide. A first deposition forms sheets of the material, which are machined to the proper size to form reinforcing ribs. A sacrificial mandrel is formed with grooves to receive the ribs in their assembled positions. The ribs are then assembled in the mandrel. The upper surface of the mandrel is in proximity to the rear edges of the ribs to form a substantially continuous surface. The mandrel and ribs are then subjected to a chemical vapor deposition process, the second of the method. This forms a first coating upon the outer face of the mandrel, with this coating being intimately secured to the rear edges of the ribs. This first coating forms a back plate and side wall, and is appropriately machined. The mandrel is then turned over, and the base is removed by machining to expose the front edges of the ribs. This process leaves islands of mandrel material between the ribs to form a substantially continuous surface. The mandrel and ribs are then subjected to a chemical vapor deposition process, the third of the method. This forms a second coating upon the lower surface of the mandrel, with this coating being intimately secured to the inner edges of the ribs. This second coating is used as a mirror face. To reduce weight, holes are drilled through the back plate, and the remaining, encapsulated, mandrel material is removed by oxidation, melting, etc. The mirror blank may then be appropriately machined to form the mirror surface.

BRIEF DESCRIPTION OF THE DRAWINGS

The objects and features of the invention noted above are explained in more detail with reference to the drawings, in which like reference numerals denote like elements, and in which.

DETAILED DESCRIPTION OF THE INVENTION

Figure 1:
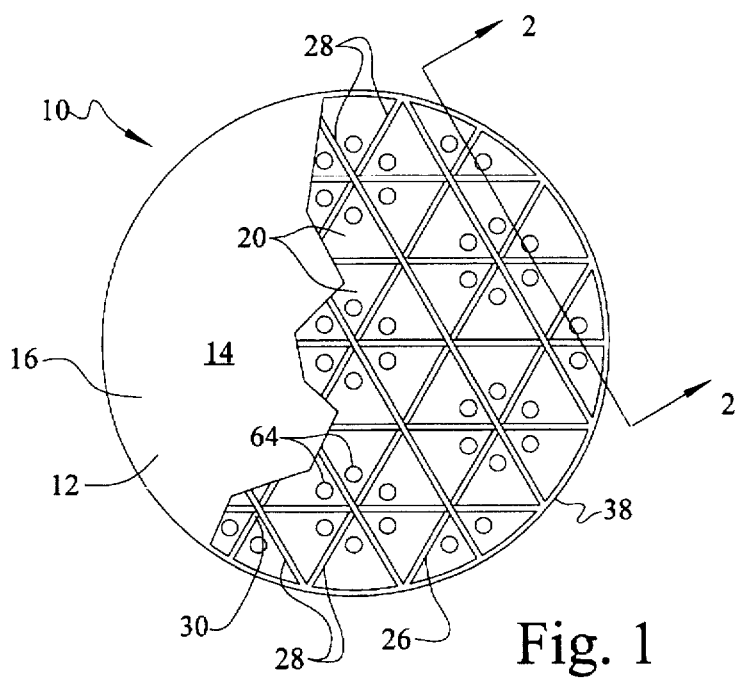
FIG. 1 is a front view, in partial break-away, of a mirror formed according to the present invention.
Figure 2:
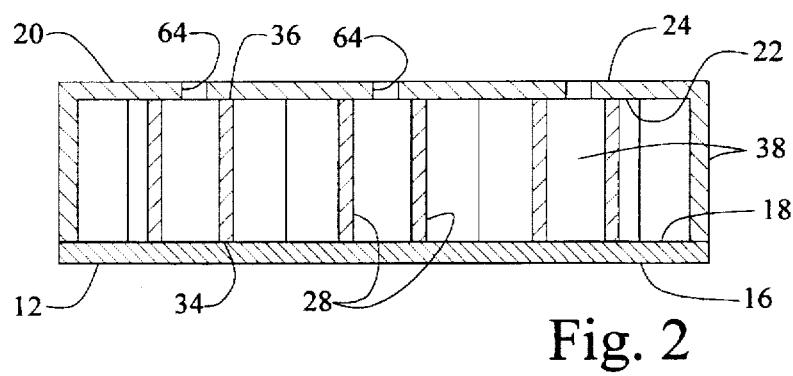
FIG. 2 is a cross-sectional view along line 2—2 of FIG. 1.

With reference to FIG. 1, a mirror according to the present invention is generally designated by reference numeral 10. The mirror 10 includes a front face 12 which will form the actual mirror surface 14. As discussed in more detail below, the face 12 may be planar, or form a curve, such as a section of a sphere, parabola, etc, either concave or convex. The front face 12 will have an outer surface 16, which will form the mirror surface 14, and an inner surface 18 (FIG. 2).

The mirror 10 also includes a back plate 20. The back plate 20 will typically be planar, although may be curved in a manner analogous to the front face 12. The curvature of the back plate may be the same as that of the front face 12, or may be different. In general, the back plate 20 is located in spaced parallel relation to the front face 12. The back plate includes an interior surface 22, opposed to the front face 12 (and in particular the inner surface 18 of the front face), and an exterior surface 24.

Extending between the front face 12 and the rear plate 20 is a cell structure 26. The cell structure is formed of a plurality of legs 28. The legs 28 are joined together at their ends 30 to form a plurality of closed cells 32. The cells 32 are arranged, with common edges (i.e., legs 28) between adjacent cells to form a pattern providing structural rigidity and strength. The legs 28 have front edges 34 which are secured to the inner surface 18 of the front face, and rear edges 36 which are secured to the interior face of the back plate 20. The periphery of the cell structure 26 is formed by a side wall 38 which extends between the outer, free, ends 30 of the legs 28, and between the inner surface 18 of the front face 12 and the interior surface 22 of the back plate 20.

The mirror 10 as described above is preferably formed of a single material, with this material having as close to optimum properties as possible for the particular application of the mirror. Preferred materials include silicon, and silicon carbide (SiC), with high purity β-phase SiC being typically most preferred. This material provides: high strength; low weight; good to excellent thermal conductivity; a very desirable low thermal expansion coefficient; and excellent optical properties at a range of wavelengths commonly used in lasers. This material is available from the present assignee, and methods of making this material, suitable for use in the present method, are described in U.S. Pat. No. 5,465,184 to Pickering et al., issued Nov. 07, 1995.

The methods described for making this high purity β-phase SiC involve chemical vapor deposition (CVD) of the material. These CVD processes are used in the present method as described more fully below. Because of the use of these CVD methods, the mirror 10 according to the present invention has the further advantage of being a monolithic construct of the SiC. This will be explained more fully in the following description.

The method of forming a mirror according to the present invention will now be described.

As a first step, the legs 28 are formed. The initial procedure for this step is to produce a sheet of material suitable for use as the legs. In the preferred embodiment, where all components of the mirror are formed of the same materials, this will include forming a sheet of high purity β-phase SiC using a CVD process such as described in the above-noted US Patent to Pickering et al. The sheet will preferably be rather large, so as to enable numerous legs to be harvested from the single sheet, and most preferably the entire number of legs required for at least one mirror. Following CVD to form the sheet, the sheet will be machined for a constant thickness (typically on the order of 0.04" or 1 mm) to form a blank (not shown), and then cut to form a plurality of rib blanks, in the form of elongated rectangles (not shown). The size of these rectangles will of course vary depending upon the desired size of the mirror 10. It should be apparent to those skilled in the art that the step of machining for thickness could be postponed until after cutting the rectangular rib blanks.

Figure 3:
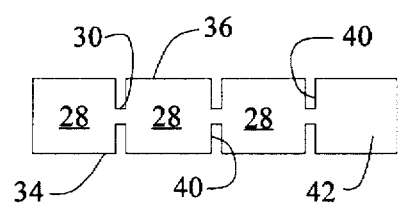
FIG. 3 is a side view of a strut according to the present invention.

The rib blanks are then machined to form at least one assembly slot 40 in each rib blank, as shown in FIG. 3, thus forming each rib blank into a rib 42. The rib slots 40 of the various ribs will enable the ribs to be assembled together into the cell structure 26. As will be apparent, the locations of the slots 40 will correspond to the various ends 30 of the legs 28, such that each rib 42 will form two or more of the legs 28.

Figure 4:
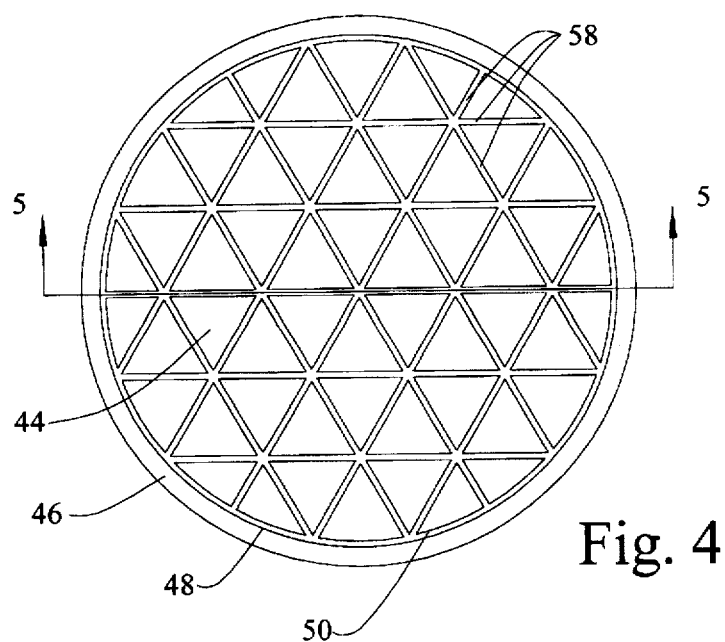
FIG. 4 is a plan view of a mandrel according to an embodiment of the present invention.
Figure 5:
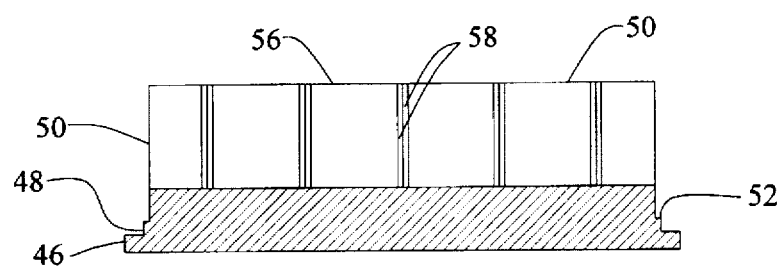
FIG. 5 is a cross-sectional side view along line 5—5 of FIG. 2.

Before the ribs are assembled together to form the cell structure, a mandrel 44 is formed, as shown in FIGS. 4 and 5. The mandrel 44 will act as a support or jig for the ribs 42, and also as a deposition surface. The mandrel must therefore be formed of a material which is sufficiently rigid, and which will survive the temperatures of deposition, at least in the full deposition environment. Furthermore, the mandrel material must be sacrificial, in that it can be destroyed at a later time by some process which will not cause harm to the mirror blank. Finally, the mandrel material should very preferably have a coefficient of thermal expansion as close as possible to the material of the mirror.

For the embodiment shown, graphite is a preferred material. Graphite is rigid, will survive elevated temperatures in an atmosphere devoid of oxygen (such as used during deposition), does not interfere appreciably with the deposition process, and may be oxidized (i.e., burned out) in a oxygen atmosphere at a temperature which will not harm the mirror. Additionally, graphite having a coefficient of thermal expansion very similar to that of the high purity β-phase SiC is commercially available in blocks of sufficient size to form mandrels for even large mirror sizes. Finally, graphite is readily machined to the appropriate shape of the mandrel.

As is best shown in FIGS. 4 and 5, the mandrel is formed with a base 46. The base leads to a lower rim 48, which is spaced peripherally inward from the edge of the base 46. The rim 48 in turn leads to a jig portion 50 extending upward from the rim 48. The jig portion is spaced peripherally inward from the rim, such that the rim forms an upward facing shoulder 52 at the lower end of the jig portion 50. In the embodiment shown, these mandrel components are shown as circular. While this is typically the preferred arrangement, other geometric shapes are of course possible.

The jig portion 50 takes the general form of a block (in this case a cylindrical block), having an edge wall 54 intersecting with the shoulder 52 of the rim 48, and having a top face 56. This top face has the desired configuration for the to-be-formed back plate 20 of the mirror. In other words, the top face 56 will be flat if a flat back plate is desired, the top face 56 will be a section of a sphere if a spherical back plate is desired, etc. Similarly, the shape of the edge wall 54 will determine the shape of the side wall 38 of the mirror.

The jig portion 50 includes a plurality of support grooves 58 extending therethrough, with the support grooves opening onto the top face 56 and the edge wall 54. These grooves have a depth at most equal to that of the edge wall, and preferably less. Specifically, the grooves 58 should not extend below the shoulder 52, for reasons apparent below. The grooves 58 intersect at numerous points to take the form of the cell structure 26.

The support grooves have a width to closely receive the ribs 42. Each of the ribs will be received in an associated one of the support grooves, with the front edges 34 of the ribs inserted first, and the rear edges 36 accessible from the top face 56 of the mandrel. In the embodiment shown, each of the ribs has a length corresponding to the length of its associated support groove, such that the ends of the ribs are approximately flush with the edge wall 54. Similarly, the rear edges 36 of the ribs are approximately flush with the top face 56. If the top face is curved, this will of course require that the rear edges be appropriately shaped to conform to the curved top face along the particular path of the rib. In a similar manner, if the front face of the mirror is to be curved the front edges of the ribs will have appropriate curves, as will the grooves 58 to provide a mating arrangement.

As is apparent from the intersecting nature of the grooves 58, if the ribs are formed to extend the entire length of the grooves the ribs will intersect. It is possible to form some or all of the ribs having a length equal to that of the legs 28, and thus of the grooves between intersections. Such ribs would fit within the grooves with their ends in proximity without further effort. For longer ribs, however, the slots 40 permit assembly.

Figure 6:
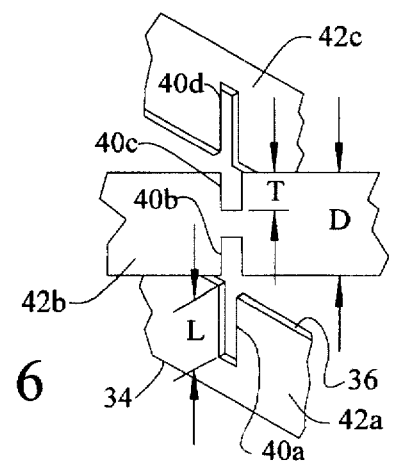
FIG. 6 is a perspective view illustrating assembly of ribs according to the present invention.

In particular, the slots 40 are formed such that the ribs may be placed in an interlocking arrangement. For the arrangement shown, the cell structure takes the form of an array of triangles, in this case equilateral triangles. As such, at each vertex there are three ribs intersecting. To permit the three ribs to intersect, the slots 40 in the ribs are formed as shown in FIG. 6. Specifically, a first rib 42a, having a depth D common to all three of the ribs at this intersection point, is provided with a slot 40a extending across the depth of the rib from the rear edge 36, and having a length L. A second rib 42b is provided with a first slot 42b extending from its front edge 34, and having a length slightly greater than (D–L). As such, the slot 40a of the first rib may receive the second rib, while the slot 40b of the second rib may receive the first rib.

In a similar manner, the second rib 42b is provided with a second slot 40c extending from its rear (opposite) edge 36, and having a length T (with T of course being less than length L). A third and final rib of the intersection is provided with a slot 42d extending from its front edge 34, and having a length slightly greater than (D–T). Therefore, the slot 40c of the second rib may receive the third rib, while the slot 40d of the third rib may receive the second rib. The ribs thus do not interfere with each other, and may be interlocked. The width of the slots 40 is chosen to permit this interlocking, but provide a sliding fit, to thus reduce the amount of movement available to the ribs of the cell structure.

To ease assembly for the triangular cell arrangement shown, it is noted that the various cells are formed of three sets of parallel ribs, each offset from the other by 60°. As such, the first set of parallel ribs may be provided with the slots 40a, and may be inserted into the appropriate grooves 58 first. This will result in the slots 42a opening toward the top face 56. Thereafter, the second set of parallel ribs, provided with the slots 40b and 40c are inserted into their associated grooves 58, interlocking with the first ribs. The slots 40c of the second ribs are again open toward the top face 56. Finally, the third set of ribs, provided with the slots 40d are inserted into their associated grooves, again interlocking and completing the cell structure. From the above description it should be apparent to those in the art that other geometric cell arrangements, such as square or hexagonal, are possible, and the appropriate slot configurations to form such a cell structure.

With the ribs assembled into the grooves of the mandrel, and interlocked with each other, it may be seen that they are secure. At this point in the process, the mandrel and rib combination is placed into an appropriate CVD furnace, and subjected to CVD of the mirror material (in this case the high purity β-phase SiC). During this process the mandrel and ribs are heated to high temperatures, on the order of 1 350° C. Forming the mandrel and ribs of materials having very similar coefficients of thermal expansion prevents any warping, or even breakage, of the ribs due to unequal expansion of the mandrel and ribs. The CVD is directed toward the top face 56 of the mandrel, and is also permitted along the edge wall 54. The base of the mandrel is protected from the deposition stream by its placement in a support position, or by appropriate coverings known in the art.

A coating of the mirror material is thereafter deposited upon the top face 56 and edge wall 54 of the mandrel. Since the rear edges 36 and ends of the ribs are accessible from the top face and edge wall, respectively, these edges and ends are also coated. Specifically, the coating forms a bond with the rear edges and ends of the ribs which securely retains these edges and ends to the coating. As the coating is preferably of the same material as the ribs, this bond is particularly strong.

In particular, at least when using the high purity β-phase SiC which is preferred, the bond in essence disappears, as the ribs and newly deposited back plate and side wall become a monolithic unit. In other words, even though the back plate and side wall are formed as a separate deposit or coating of material, the material properties are sufficiently uniform throughout the rib, interface between the rib and the back plate, and the back plate, that the rib and back plate formed using the two separate deposition steps are virtually indistinguishable from a rib and back plate which had been formed in the same deposition step. As such, even though the two components are formed in two separate steps, they are in fact a single uniform monolithic structure. This is a property of the material and the process which produces the advantageous result of greatly increased strength.

Figure 7:
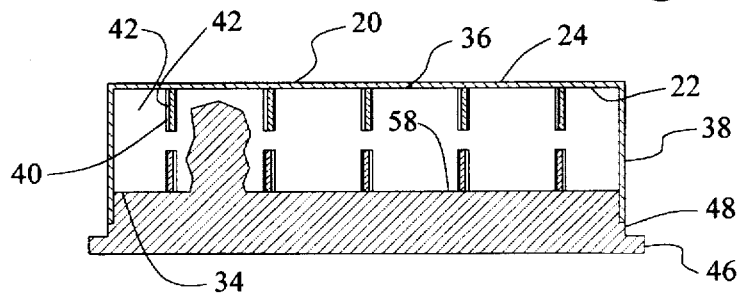
FIG. 7 is a cross-sectional view of the mandrel of FIG. 5 after assembly of ribs and a first coating step.

When the deposition process has produced a desired thickness of back plate and side wall, the mandrel and partially formed mirror are removed from the deposition furnace. If desired, the back plate and side wall are machined to a final thickness and finish while still mounted on the mandrel. This results in the configuration shown in FIG. 7. It is noted that the side wall 38 extends below (i.e., has a greater depth than) the front edge of the ribs 42. While this distance is exaggerated for clarity, at least a small amount of this greater depth is preferred, as made clear below.

Figure 8:
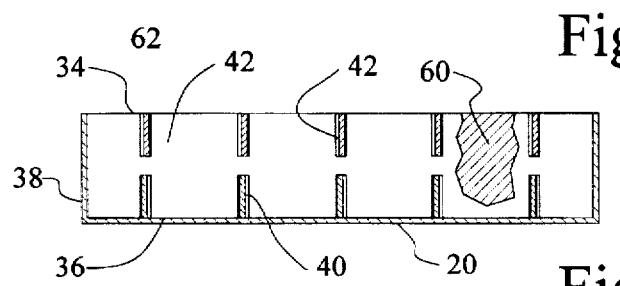
FIG. 8 is a cross-sectional view of the mandrel of FIG. 5 after removal of mandrel material in preparation for a second coating step.

The next step is to machine the mandrel itself. As shown in FIG. 8, the base 46 and rim 48 of the mandrel are removed to expose the front edges 34 of the ribs. This results in islands 60 of mandrel material being located in each cell, surrounded by the legs 28, or the legs 28 and side wall 38. During this removal of mandrel material, any excess depth in the side wall 38 is also removed, such that the side wall has its desired final depth. Forming the side wall longer than the ribs ensures that the side wall will have the proper length as required for the next step. The exposed face of each island 60, together with the front edges and side wall edge, forms a substantially continuous formed surface 62. This surface 62 will at least roughly correspond to the final shape of the front face of the mirror 10 (i.e., planar, spherical, etc.).

The partially formed mirror, along with the islands 60, are then placed back in the deposition furnace, and subjected to a third CVD process. During this deposition the deposition stream is directed to the formed surface 62. Appropriate coverings are provided to prevent deposition on the outer peripheral face of the side wall and on the back plate. This deposition process provides a coating of the mirror material on the front surface, forming the front face 12. As with the formation of the back plate, the coating adheres to the front edges 34 of the ribs, and to the from edge of the side wall 38, forming a strong bond such that the front face, ribs and side wall become a monolithic unit.

When deposition has created a desired thickness of front face 12, the partially formed mirror 10 is removed from the furnace. It is noted that this step has encapsulated the islands 60 of mandrel material within the mirror 10. The front face 12, and in particular the outer surface 16 of the front face, may then be machined to at least a rough approximation of its final form. For certain applications where weight (and interior venting) are not strong concerns, the outer surface 16 may be given final machining, polishing, etc. to provide its final reflective surface. If this is the case the mirror 10 is now completed.

For most applications, however, weight (and venting) are concerns. For these applications the back plate 20 is provided with a plurality of access holes 64 extending therethrough. An access hole 64 is provided for each cell of the cell structure 26. Thereafter, the mirror is subjected to an appropriate process to remove the encapsulated islands of mandrel material. For the preferred graphite, oxidation (i.e., burning) is a suitable process. It is noted that the preferred SiC is not harmed by the elevated temperatures required to oxidize the graphite, and that these temperatures are lower than those used in the deposition steps. The graphite was not oxidized in these previous deposition steps due to the fact that oxygen was not present in the deposition furnaces, and as such oxidation of the graphite was not possible. For other mandrel materials other removal steps could be employed, such as heating to melt, acid etching, etc.

When the islands of mandrel material have been removed, their weight is also of course removed, resulting in a light weight mirror 10. Additionally, the holes 64 in the back plate permit venting of the cells, which is a concern should the mirror be used in space, since trapped gas in the cells would exert pressure much higher than the vacuum of space. At this time any final machining, polishing, etching, etc. of the outer surface 16 is performed to provide the desired mirror finish. In this regard it is noted that the preferred high purity β-phase SiC may be finished to within 1–5 Å RMS, as measured on a Talystep mechanical contact profiler.

As may be seen, the mirror according to the present invention provides light weight, increased rigidity, excellent thermal conductivity, and excellent optical characteristics. Furthermore, the mirror according to the present invention is improved over the prior art CVD-produced mirror, as shown in the above noted U.S. Pat. No. 5,071,596 to Goela et al., by the addition of the back plate. This back plate provides a more rigid mirror, ensuring better optical performance due to reduced flexing. Additionally, the present mirror is improved by the use of only one component material rather than the graphite and SiC of that prior art mirror. This single material ensures both stronger bonds between components and identical coefficients of thermal conductivity, again reducing flexure and improving optical performance. Finally, the present method produces mirrors with less expense than the prior art CVD process modified for comparability.

Specifically, both the present and the prior art method employ three CVD processes to produce the mirror. However, the prior art process employed graphite ribs. If the present process were modified to employ graphite ribs, the number of CVD processes required would drop to two, providing a cost savings over the prior art method for comparable mirrors. Alternatively, if the prior art method were modified to employ SiC ribs, as in the present invention, the required number of CVD processes would be increased to four. This of course would be more expensive than the three processes of the present invention.

From the foregoing it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

What is claimed is:

1. A process for forming a light weight, closed-back mirror, comprising the steps of:

provided a sacrificial mandrel having a base, a top face, and an edge wall, and a plurality of grooves extending into said top face in a cell structure pattern;

providing a plurality of legs in associated ones of said grooves to thus form said legs into said cell structure pattern, rear edges of said legs forming, with said top face, a substantially continuous surface;

chemical vapor depositing a coating of material upon said substantially continuous surface to form a back plate bonded to said rear edges of said legs;

removing mandrel material from said base to expose front edges of said legs and form, with said front edges, a substantially continuous formed surface, while leaving islands of mandrel material within said cell structure; and chemical vapor depositing a coating of material upon said substantially continuous formed surface to form a front face bonded to said front edges of said legs.

2. A process as in claim 1, wherein said step of providing a plurality of legs further includes:

chemical vapor depositing a coating of leg material upon a surface to form a blank upon said surface; and forming said legs using a step chosen from the group consisting of 1) machining said blank to cut legs from said blank and thereafter removing said legs from said blank, and 2) removing said blank from said surface and thereafter machining said blank to cut legs from said blank.

3. A process as in claim 2, wherein said step of depositing a coating of leg material comprises depositing a coating of high purity β-phase SiC.

4. A process as in claim 2, wherein said step of providing said mandrel further includes providing said mandrel with said grooves intersecting, said legs extending between said intersections.

5. A process as in claim 4, wherein said step of machining said legs includes machining ribs from said blank, each of said ribs forming a plurality of said legs, each said rib including at least one slot extending inward from at least one of said edges and positioned such that said slots of intersecting ones of said ribs are mating to permit said intersecting of said ribs.

6. A process as in claim 5, wherein said step of depositing a coating of leg material comprises depositing a coating of high purity β-phase SiC.

7. A process as in claim 6, wherein said steps of depositing a coating to form a back plate and a front plate both comprise depositing a coating of high purity β-phase SiC.

8. A process as in claim 7, wherein said step of providing a mandrel includes providing such a mandrel formed of graphite.

9. A process as in claim 1, wherein at least a portion of said grooves extend to said edge wall of said mandrel, and including the further step, prior to said step of depositing a coating to form a front face, of depositing a coating of material upon said edge wall to form a side wall bonded to ends of said legs.

10. A process as in claim 9, wherein said step of depositing a coating to form a side wall is performed simultaneously with said step of applying a coating to form a back plate.

11. A process as in claim 9, wherein said step of providing a plurality of legs further includes:
chemical vapor depositing a coating of leg material upon a surface to form a blank upon said surface; and
forming said legs using a step chosen from the group consisting of 1) machining said blank to cut legs from said blank and thereafter removing said legs from said blank, and 2) removing said blank from said surface and thereafter machining said blank to cut legs from said blank.

12. A process as in claim 11, wherein said step of providing said mandrel further includes providing said mandrel with said grooves intersecting, said legs extending between said intersections.

13. A process as in claim 12, wherein said step of machining said legs includes machining ribs from said blank, each of said ribs forming a plurality of said legs, each said rib including at least one slot extending inward from at least one of said edges and positioned such that said slots of intersecting ones of said ribs mating to permit said intersecting of said ribs.

14. A process as in claim 13, wherein said step of depositing a coating of leg material comprises depositing a coating of high purity β-phase SiC.

15. A process as in claim 13, wherein said steps of depositing a coating to form a back plate and a front plate both comprise depositing a coating of high purity β-phase SiC.

16. A process as in claim 1, including the further steps of:
providing holes through said back plate to access at least a portion of said islands of mandrel material; and
removing said portion of said islands of mandrel material.

17. A process as in claim 16, wherein said step of removing said islands includes oxidizing said portion of said islands.

18. A process as in claim 16, wherein said step of providing holes through said back plate includes providing said holes to access all of said islands of mandrel material.

19. A process as in claim 16, wherein said step of providing a plurality of legs further includes:
chemical vapor depositing a coating of leg material upon a surface to form a blank upon said surface; and
forming said legs using a step chosen from the group consisting of 1) machining said blank to cut legs from said blank and thereafter removing said legs from said blank, and 2) removing said blank from said surface and thereafter machining said blank to cut legs from said blank.

20. A process as in claim 19, wherein said step of providing said mandrel further includes providing said mandrel with said grooves intersecting, said legs extending between said intersections.

21. A process as in claim 20, wherein said step of machining said legs includes machining ribs from said blank, each of said ribs forming a plurality of said legs, each said rib including at least one slot extending inward from at least one of said edges and positioned such that said slots of intersecting ones of said ribs are mating to permit said intersecting of said ribs.

22. A process as in claim 16, wherein at least a portion of said grooves extend to said edge wall of said mandrel, and including the further step, prior to said step of depositing a coating to form a front face, of depositing a coating of material upon said edge wall to form a side wall bonded to ends of said legs.

23. A process as in claim 22, wherein said step of depositing a coating to form a side wall is performed simultaneously with said step of applying a coating to form a back plate.

24. A process as in claim 22, wherein said step of providing a plurality of legs further includes:
chemical vapor depositing a coating of leg material upon a surface to form a blank upon said surface; and
forming said legs using a step chosen from the group consisting of 1) machining said blank to cut legs from said blank and thereafter removing said legs from said blank, and 2) removing said blank from said surface and thereafter machining said blank to cut legs from said blank.

25. A process as in claim 24, wherein said step of providing said mandrel further includes providing said mandrel with said grooves intersecting, said legs extending between said intersections.

26. A process as in claim 25, wherein said step of machining said legs includes machining ribs from said blank, each of said ribs forming a plurality of said legs, each said rib including at least one slot extending inward from at least one of said edges and positioned such that said slots of intersecting ones of said ribs mating to permit said intersecting of said ribs.

27. A process as in claim 26, wherein said steps of depositing a coating to form a back plate and a front plate both comprise depositing a coating of high purity β-phase SiC.

28. A process as in claim 27, wherein said step of depositing a coating to form a side wall is performed simultaneously with said step of applying a coating to form a back plate.

29. A process as in claim 16, wherein said step of providing holes through said back plate includes providing said holes to access all of said islands of mandrel material.

30. A process as in claim 29, wherein said step of providing said mandrel includes providing such a mandrel formed of graphite.

* * * * *

UNITED STATES PATENT AND TRADEMARK OFFICE
CERTIFICATE OF CORRECTION

PATENT NO. : 5,741,445
DATED : April 21, 1998
INVENTOR(S) : Taylor, et al.

It is certified that error appears in the above-indentified patent and that said Letters Patent is hereby corrected as shown below:

On the title page, item [54] and Column 1, line 1,
   in the title, delete "LIGHTWEIGHT" and insert --LIGHT WEIGHT-- therefor.

Column 6, line 57, delete "from" and insert --front-- therefor.

Signed and Sealed this

Eighteenth Day of August, 1998

*Attest:*

BRUCE LEHMAN

*Attesting Officer*     *Commissioner of Patents and Trademarks*